US006803762B2

(12) United States Patent
Shah et al.

(10) Patent No.: US 6,803,762 B2
(45) Date of Patent: Oct. 12, 2004

(54) PULSE TRAIN, NUCLEAR MAGNETIC RESONANCE TOMOGRAPH AND IMAGING METHOD

(75) Inventors: Nadim Joni Shah, Jülich (DE); Sven Steinhoff, Jülich (DE); Maxim Zaitsev, Freiburg (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 10/297,705

(22) PCT Filed: May 19, 2001

(86) PCT No.: PCT/DE01/01923

§ 371 (c)(1),
(2), (4) Date: Feb. 12, 2003

(87) PCT Pub. No.: WO01/94965

PCT Pub. Date: Dec. 13, 2001

(65) Prior Publication Data

US 2004/0027126 A1 Feb. 12, 2004

(30) Foreign Application Priority Data

Jun. 9, 2000 (DE) .......................................... 100 28 171

(51) Int. Cl.[7] ................................................ G01V 3/00
(52) U.S. Cl. ....................................... 324/309; 324/307
(58) Field of Search ............................... 324/309, 307, 324/306, 312, 300

(56) References Cited

U.S. PATENT DOCUMENTS

| 4,757,260 | A | | 7/1988 | Tsuda et al. ................. 324/309 |
| 4,972,148 | A | | 11/1990 | Jensen ......................... 324/309 |
| 5,270,654 | A | * | 12/1993 | Feinberg et al. ............. 324/309 |
| 5,672,970 | A | * | 9/1997 | Takai ........................... 324/309 |
| 6,614,225 | B1 | * | 9/2003 | Feinberg ..................... 324/307 |

FOREIGN PATENT DOCUMENTS

| EP | 0357100 | 3/1990 |
| WO | 93/01509 | 1/1993 |

OTHER PUBLICATIONS

Koichi Oshio, et al, "Single–Shot GRASE Imaging without Fast Gradients," *Magnetic Resonance in Medicine* 26:355–360, XP–000294183, (1992).

* cited by examiner

*Primary Examiner*—Louis Arana
(74) *Attorney, Agent, or Firm*—Connolly Bove Lodge & Hutz LLP; Larry J. Hume

(57) ABSTRACT

The invention relates to a pulse train, to a nuclear magnetic resonance scanner, which comprises means for generating this pulse train, and to an imaging method in which the pulse train according to the invention is used. The pulse train according to the invention comprises an α high-frequency pulse, a preceding 180° pulse or a preceding 180° and a 90° pulse that precedes the 180° pulse, as well as a slice selection and a k-space line coding as well as an acquisition module, which is subsequent thereto for purposes of generating data. This invention is characterized in that the acquisition module for generating data results from at least two slices. By means of the pulse train and imaging method according to the invention, 20 slices of an image can be acquired at 16 different points in time for a matrix size measuring 256×256 during a measuring time of 8 minutes and 28 seconds. As a result, $T_1$ relaxation times can be used for the first time for imaging methods in medical diagnosis.

11 Claims, 6 Drawing Sheets

PULSE TRAIN, NUCLEAR MAGNETIC RESONANCE TOMOGRAPH AND IMAGING METHOD

This disclosure relates to: a pulse train comprising at least an a high-frequency pulse, a preceding 180° pulse, or a preceding 180° and a 90° pulse that precedes the 180° pulse, a slice selection and a k-space line coding and an acquisition module subsequent thereto; a nuclear magnetic resonance scanner; and an imaging method.

Already at the time when the method of magnetic resonance imaging (MRI) was invented, it was anticipated that this method would allow more than just simple, qualitative imaging and that it would, in fact, be suitable for generating quantitative imaging. On the one hand, MRI is a mature method that is used on a daily basis in clinical imaging for simple, qualitative image depictions. On the other hand, MRI is a very important instrument for science and industry in a wide array of application areas such as quality control, pre-clinical evaluation of drugs in the pharmaceutical industry as well as in the determination of the pore size in rock samples in the petrochemical industry. Quantitative imaging is needed for rock samples and this is also done. The MRI signals are rendered more sensitive or weighted by means of appropriate and controlled manipulation of the appertaining parameters such as pulse trains, in order to show the influence of selected parameters. Generally speaking, when a series of differently weighted images are acquired and when suitable models are employed, it is possible to generate quantitative representations of the selected parameters. In this manner, quantitative images of samples can be created for purposes of determining a certain parameter such as diffusion, proton density or spin-lattice relaxation time.

The term "sample" in the case at hand here should be construed in its broadest sense and it encompasses both living and non-living material.

Various methods are known in which a sample is examined by means of an excitation pulse and several rephasing pulses.

In the method of this type, the sample is excited by means of electromagnetic radiation at an energy level that is suitable for the excitation.

It is known procedure in nuclear magnetic resonance tomography to obtain information about a sample by exciting echo signals of the sample.

In nuclear magnetic resonance tomography, atom nuclei possessing a magnetic moment are aligned by applying an external magnetic field, a process in which the nuclei execute a precessional motion having a characteristic circular frequency (Larmor frequency) around the direction of the magnetic field. The Larmor frequency is a function of the strength of the magnetic field and of the magnetic properties of the substance, especially of the gyromagnetic constant $\gamma$ of the nucleus. The gyromagnetic constant $\gamma$ is a parameter that is characteristic for each type of atom. The atom nuclei have a magnetic moment $\mu=\gamma \times p$ wherein p stands for the spin of the nucleus.

A substance to be examined or a person to be examined is exposed to a uniform magnetic field during nuclear magnetic resonance tomography. The uniform magnetic field is also referred to as the polarization field $B_0$, and the axis of the uniform magnetic field as the z-axis. The individual magnetic moments of the spin in the tissue precede with their characteristic Larmor frequency around the axis of the uniform magnetic field.

A net magnetization $M_z$ is generated in the direction of the polarization field, whereby the randomly oriented magnetic components cancel each other out in the plane perpendicular thereto (x-y plane). After the uniform magnetic field has been applied, an excitation field $B_1$ is additionally generated. The excitation field $B_1$ is polarized in the x-y plane and displays a frequency that is as close as possible to the Larmor frequency. As a result, the net magnetic moment $M_z$ can be tilted into the x-y plane, so that a transverse magnetization $M_t$ is created. The transverse component of the magnetization rotates in the x-y plane with the Larmor frequency.

Through a variation of the excitation field over the course of time, differing time sequences can be generated for the transverse magnetization. Various slice profiles can be realized in conjunction with at least one applied gradient field.

NMR imaging methods select slices or volumes that yield a measuring signal under the appropriate emission of high-frequency pulses and under the application of magnetic gradient fields; this measuring signal is digitized and stored as a one-dimensional or multi-dimensional field in a measuring computer.

This multidimensional field resulting from the measurement can be depicted in a spatial frequency space, the k-space. The coordinates of this spatial frequency space result from $\underline{k}=-\gamma \int \underline{G} dt$. The outer area of the k-space defines the structures of the reconstructed image while the inner area defines the contrast.

The desired image information is then acquired (reconstructed) from the gathered raw data by means of one-dimensional or multi-dimensional Fourier transformation. Before that, there could be a need for the measured data of the multidimensional data field to be arranged in the data memory in such a way that the appertaining k-spaces yield the corresponding slices. Sorting procedures are implemented for this purpose.

A reconstructed slice image consists of pixels, and a volume data record consists of voxels. A pixel (picture element) is a two-dimensional image element, for instance, a square. The image is made up of pixels. A voxel (volume pixel) is a three-dimensional volume element, for instance, a right parallelepiped. The dimensions of a pixel are in the order of magnitude of 1 $mm^2$, and those of a voxel are in the order of magnitude of 1 $mm^3$. The geometries and extensions can vary.

Seeing that, for experimental reasons, it is never possible to assume a strictly two-dimensional plane in the case of slice images, the term voxel is often employed here as well, indicating that the image planes have a certain thickness.

Little attention has been paid to the representation of the spin-lattice relaxation time, $T_1$, since most of the methods presented in the literature require long acquisition times that render these methods unusable for routine clinical examinations.

The advantage of the rapid data acquisition that was attained employing the rapid "Inversion-Recovery (Inversion—Relaxation) EPI (echo-planar imaging) Method" by R. J. Ordidge et al. in Magnetic Resonance in Medicine 16, 238–245 (1990) did not become well established because EPI is not a method in widespread use. In fact, inherent artifacts associated with this method have prevented the utilization of this otherwise elegant method. This is particularly true in those cases where imaging of the highest quality is needed, such as in the segmentation of the human brain. Other quantitative imaging methods (Deichmann et al. in Journal of Magnetic Resonance, 96, 608–612 (1992); Blüml et al., MRM 30, 289–295 (1993); Deichmann et al. in Magnetic Resonance in Medicine, 42: 206–209 (1999)) are slower than IR-EPI and are not fast enough to attain practical significance. The two approaches are based mainly on the spectroscopic Look-Locker methods Look DC and Locker DR (The Review of Scientific Instruments, volume 41, no. 2, 250–251, (1970)), which makes use of successive excitation pulses during a longitudinal relaxation so as to gather numerous points in time during the relaxation. A more effective time-representation scheme that neutralizes movement artifacts can be created in this manner.

The original "snapshot FLASH" method by Deichmann et al. in Journal of Magnetic Resonance, 96, 608–612 (1992) calls for long acquisition times since the initial magnetization has to be completely re-established. In the case of a high spatial resolution, the time resolution is markedly restricted. This especially has an effect in nuclear magnetic resonance scanners without a high-performance gradient system.

In nuclear magnetic resonance tomography of the brain, especially of the human brain, there is need to acquire measuring points over the entire brain volume, thus leading to the highest possible resolution of a slice image while generating as many slice images as possible within a brief period of time. This requirement is particularly pressing when sick or severely injured people have to be diagnosed quickly. The prior-art methods need a very long acquisition time of more than one hour and are thus not suitable for clinical use. The methods based on "snapshot FLASH" approach are faster. However, since these are single-slice methods, a high spatial resolution cannot be achieved. Methods based on EPI are very fast but they entail numerous disadvantages which lie in the very nature of the methods. These artifacts include ghost images resulting from phase errors and at times severe geometrical interferences.

SUMMARY OF THE INVENTION

Therefore, the invention has the objective of creating an imaging method, a nuclear magnetic resonance scanner and a pulse train which, within the shortest time possible, generate a slice image or a sequence of slice images of the brain at an extremely high resolution.

This objective is achieved according to embodiments of the invention at least in part by an acquisition module which generates data results from at least two points in time, and at least two slices.

The imaging method according to an embodiment of the invention allows, for example, the acquisition of 20 slices at 16 different points in time for a matrix measuring 256×256 within a measuring time of 8 minutes and 28 seconds.

Advantageous refinements of the invention are given in the subordinate claims.

BRIEF DESCRIPTION OF THE DRAWINGS

The figures show various test results and parameters.

The following is shown.

DETAILED DESCRIPTION

The invention will be explained below by way of an example.

Figure 1:
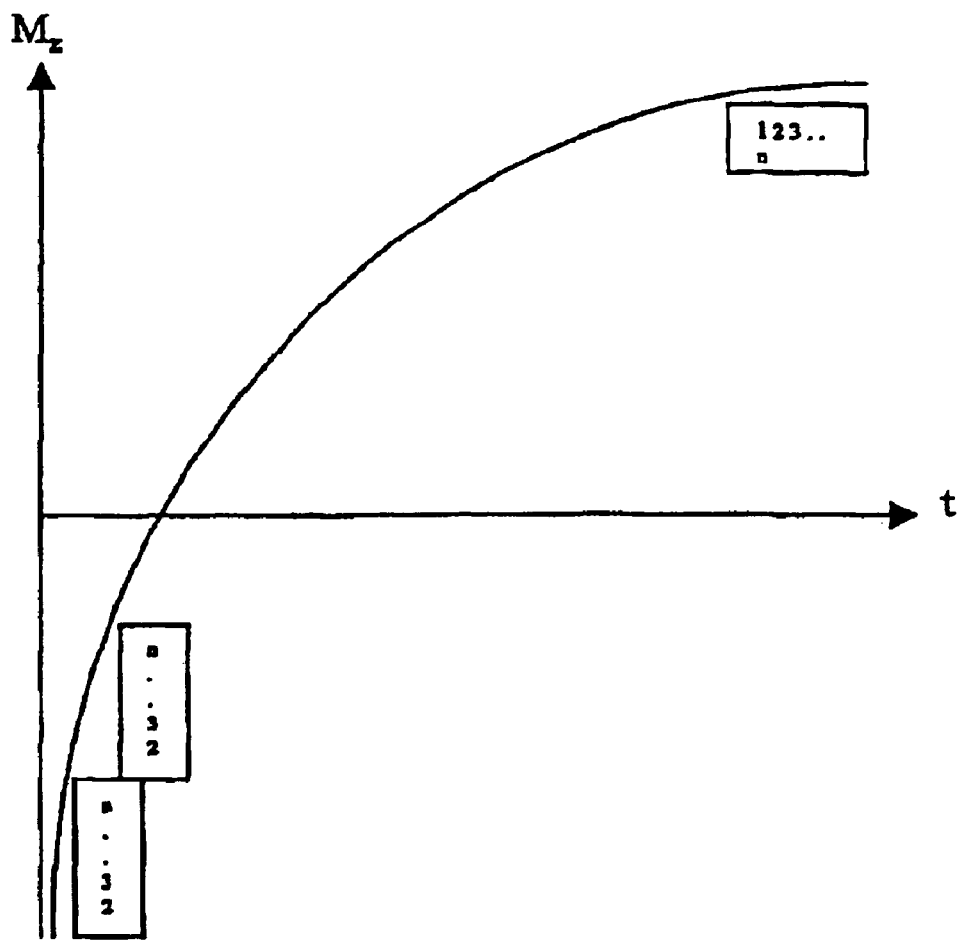
FIG. 1—a scanning scheme of the pulse train according to the invention.
Figure 2A:
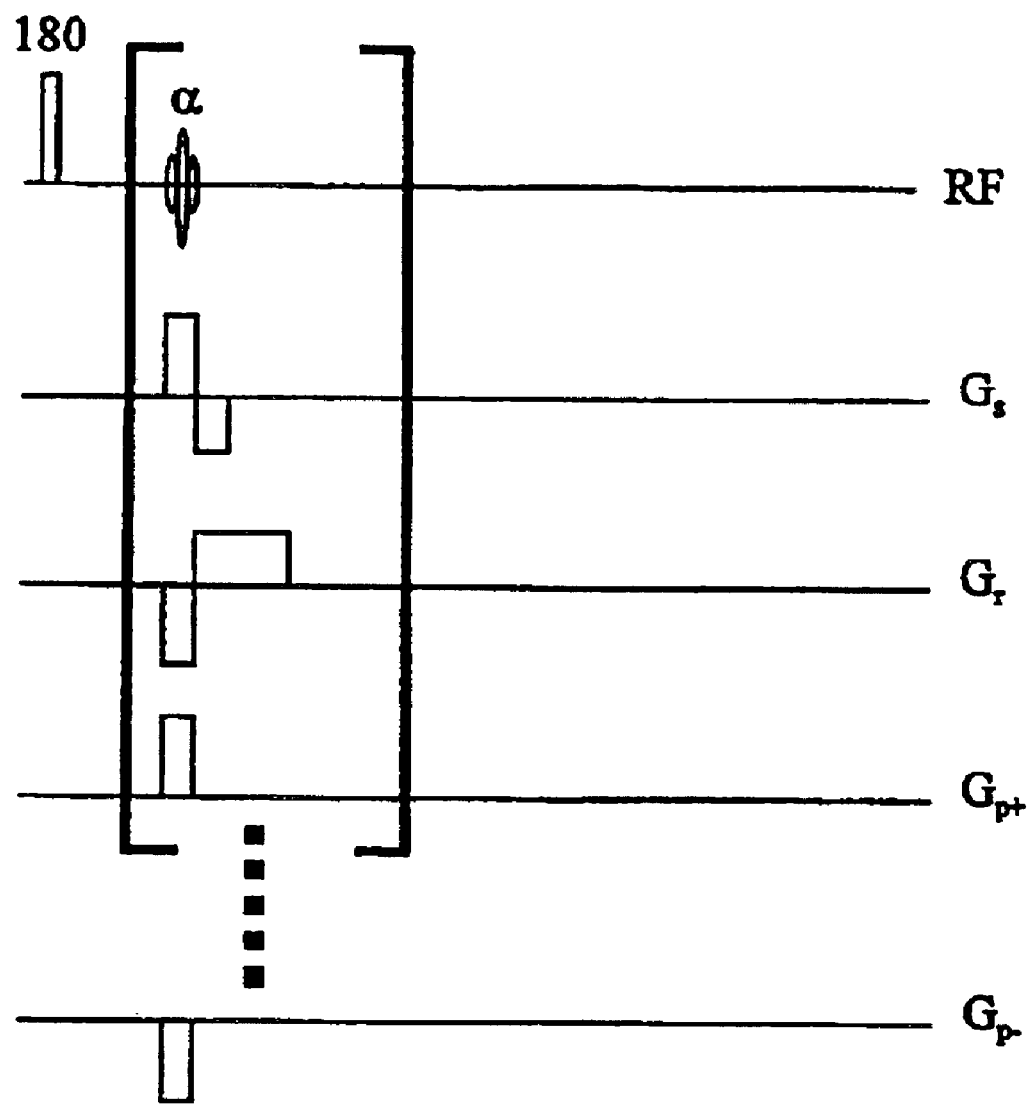
FIGS. 2a, 2b—a pulse train according to invention.
Figure 2B:
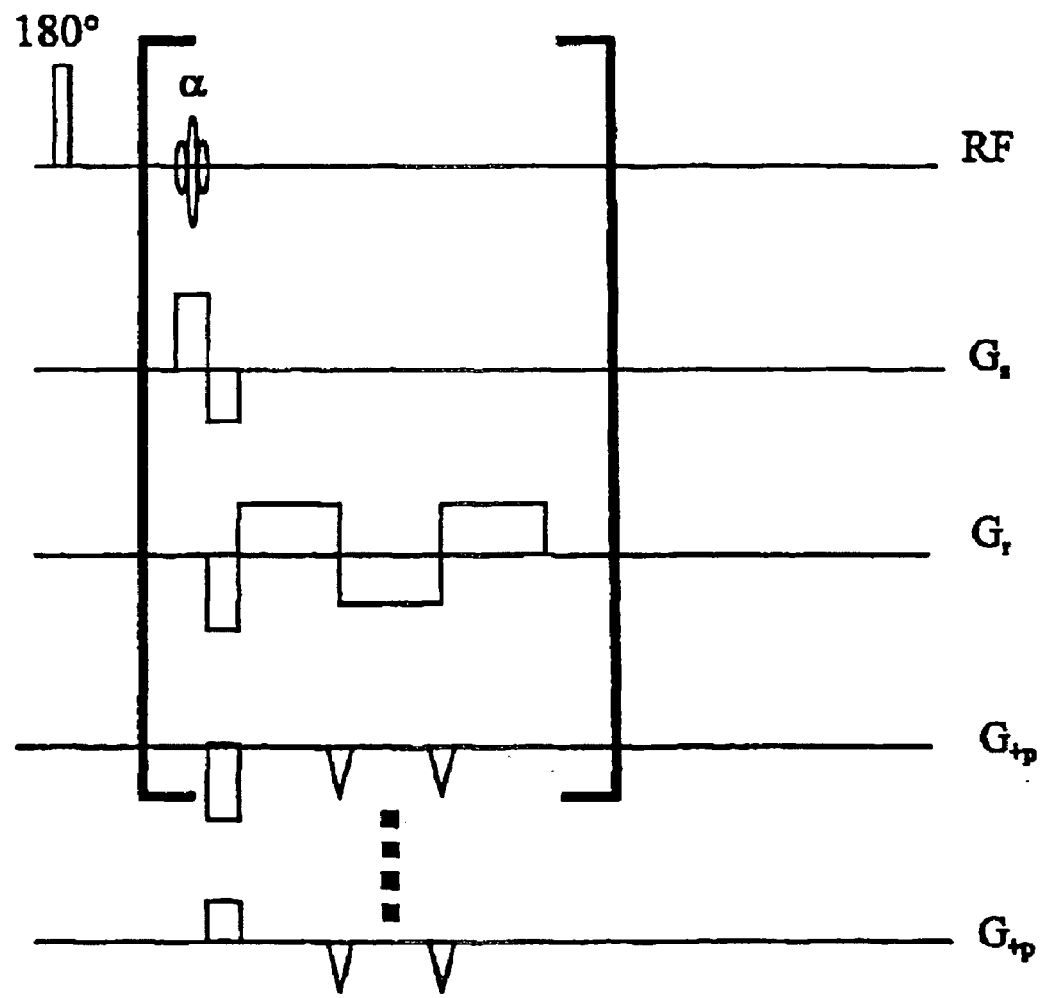

In the execution of the method according to the invention for the determination of the longitudinal relaxation constant $T_1$, the sample, for instance, the skull of the patient to be examined, is placed into the coil of a nuclear magnetic resonance scanner. The sample lies in the center of the homogeneous, static basic magnetic field $B_0$. The spatial resolution is done using magnetic fields that change over the course of time (gradients). Due to their design, these are arranged in a Cartesian coordinate system. In order to obtain data, a high-frequency excitation field has to be generated. The excitation frequency is dependent, on the one hand, on the static basic field and, on the other hand, on the type of nucleus of the sample to be examined. Once excitation has been completed with a non-slice-selective (or else volume-selective) 180° pulse or, as an alternative, a 90° pulse followed by a 180° pulse—both of which are non-slice-selective or both of which are volume-selective—the data is acquired in two sequences that differ from each other. After the 180° pulse, the transversal magnetization $M_{xy}$ has to be zero (for instance, due to gradient spoiling). In both cases, for purposes of acquiring data, an high-frequency pulse (α) is applied, combined with gradient sequences in order to generate at least one k-space-coded echo. This measuring scheme (high-frequency pulses (α) and gradient sequence) will be hereinafter referred to as the acquisition module. After the measurement has been completed, the k-space has been completely scanned. The high-frequency pulse (α) serves to excite a selected slice or slice thickness and can assume the pulse forms that are commonly known to the person skilled in the art. These are, for instance, Gauss pulses or sinc pulses. The pulse trains for both possibilities can be seen in FIGS. 2a and 2b. The square brackets shown in FIGS. 2a, 2b schematically depict the use of the sequence present inside the square brackets (acquisition module) on slices or points in time. In this context, FIG. 2b relates to the acquisition scheme in which three k-space lines are measured after each high-frequency pulse (α). FIG. 2 describes the acquisition case for one k-space line per high-frequency pulse (α). Parallel to these high-frequency pulses, the slice of interest is determined on the basis of the slice selection gradient $G_z$ ($G_s$). Subsequently, the voxel magnetizations are rephased by means of a slice selection gradient having the opposite algebraic sign. During the rephasing, a gradient $G_x$ ($G_r$) is applied that dephases the voxel magnetizations, thus effectuating a coding in the k-space. At the same time, a gradient $G_y$ ($G_p$) is applied in order to dephase the voxel magnetization so as to, in turn, carry out a k-space coding. The dephasing in the x-direction, in turn, is compensated for by means of a downstream $G_x$ gradient having the opposite algebraic sign. The data acquisition takes place at the same time as this $G_x$ gradient with its rephasing effect. The surface areas below the gradients are determined in such a way that the gradient echo appears in the middle of the acquisition window (FIG. 2a). But other acquisition methods are also conceivable such as, for example, asymmetric gradient echo. Thus, one line of the k-space has been measured. The above-mentioned steps are repeated as many times as there are slices or points in time to be measured. Subsequently, the inversion pulse (180° pulse) or the combination of 90° pulse and inversion pulse is applied once again. This procedure is repeated, but in each case, the next k-space line is measured for all slices. The number of repetitions results from the number of phase coding steps. FIG. 1 shows the fundamental relaxation curve of the longitudinal magnetization and the data blocks that are acquired according to the invention in this process. Inside the data blocks—points in time—the k-space line(s) for the n slices are measured. The measurement is completed once the k-spaces for the slices or points in time have been completely scanned.

In this manner, the time span for a complete longitudinal relaxation is used according to the invention as efficiently as possible for purposes of acquiring data about several slices and several points in time. This way, more data can be acquired over a given period of time. The term data as employed by the invention refers to the gathering of information from several slices and several different points in time.

Figure 3:
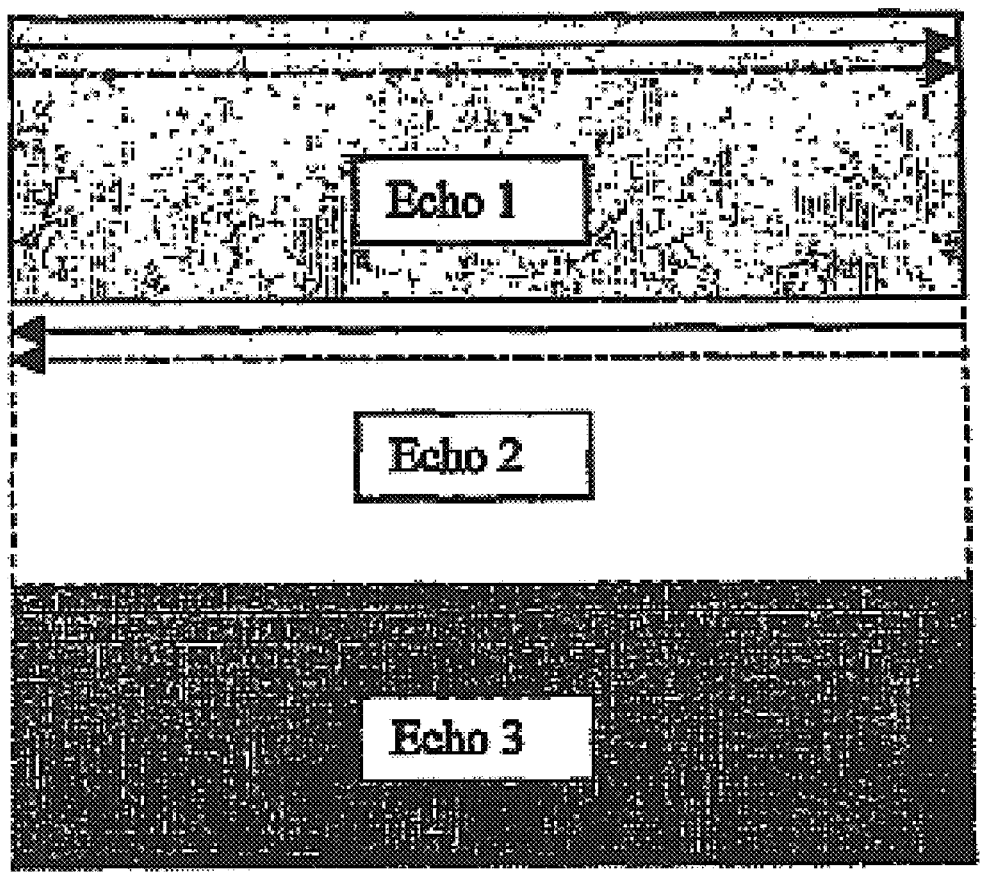
FIG. 3—representation of the echoes obtained in the k-space.

In order to configure the data acquisition more efficiently, following the slice-selective excitation by the high-frequency pulse ($\alpha$), several k-space lines can be successively measured for each slice. This process is also referred to as segmentation. The variant of the method presented here describes the logical limit of segmentation since only one k-space line is acquired per segment. The data acquisition can contain several segments such as, for instance, 5 or 7. In the method being described here, 3 k-space lines—one line per segment in each case—are acquired successively. This is done by reversing the algebraic sign of the gradient $G_x$ after the data acquisition of the preceding k-space line. Prior to that, the corresponding k-space line is coded by the phase coding gradient $G_y$ (FIG. 3).

In summary, the four pulse trains presented here can be described by means of the following sequence scheme:
(a) 180°–[($\alpha$ gradient echo measurement of one k-space line)×slices×points in time]
(b) 180°–[($\alpha$ gradient echo measurement of several k-space lines)×slices×points in time]
(c) 90°/180°–[($\alpha$ gradient echo measurement of one k-space line)×slices×points in time]
(c) 90°/180°–[($\alpha$ gradient echo measurement of several k-space lines)×slices×points in time]

In order to be able to use a Fourier transformation after the data acquisition, the previously acquired data has to be sorted. This is done in such a way that complete data records (k-spaces) are obtained each time for the appertaining slices at various points in time. This sorting takes place prior to the actual reconstruction once the measurement has been completed. The sorting process for the sequence types, based on the scheme of the measurement of one k-space line per high-frequency pulse ($\alpha$), differs from that of the measurement of several k-space lines per high-frequency pulse ($\alpha$). For the sequences that only acquire one k-space line per high-frequency pulse ($\alpha$), only the chronological data sequence determined by the pulse train has to be sorted in the measuring memory according to the k-space definition. With the sequence types that measure several k-space lines per high-frequency pulse ($\alpha$), it is necessary to additionally sort the data in such a way that each line of a k-space has the same algebraic sign.

Figure 4:
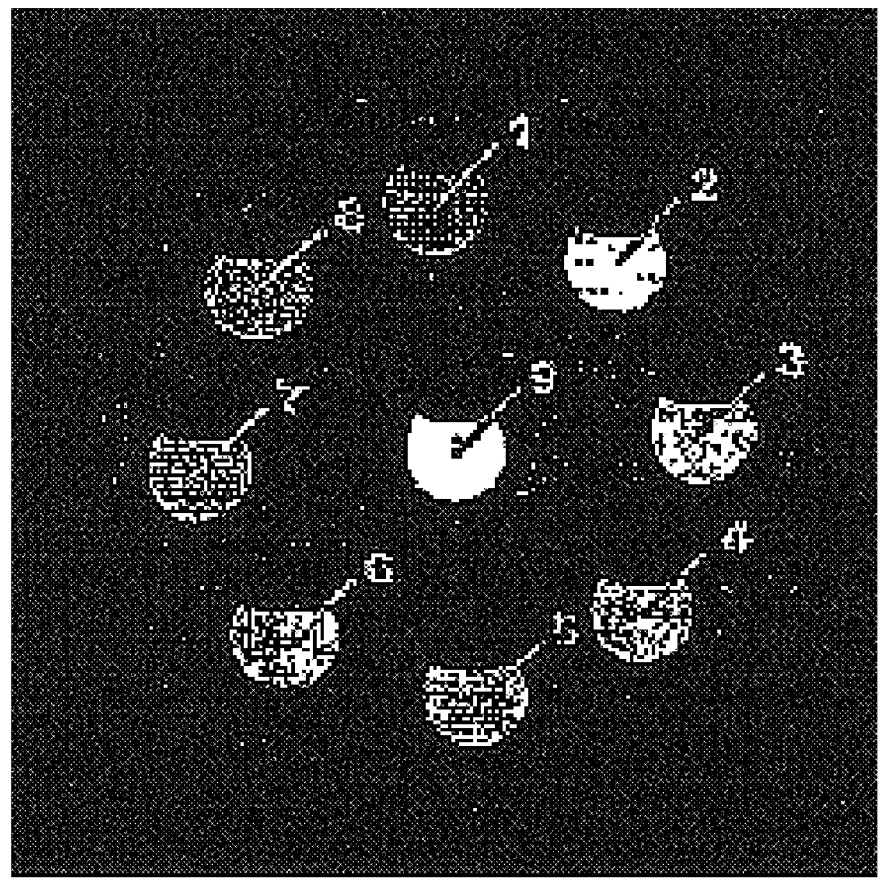
FIG. 4—reconstructed relaxation map of a ghost image.
Figure 5:
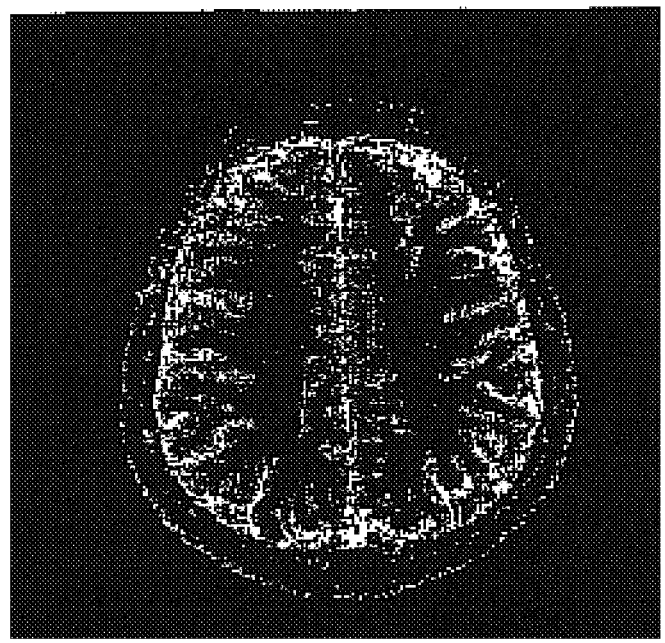
FIG. 5—quantitative in vivo $T_1$ maps of a cross section through the human brain.
Figure 5:
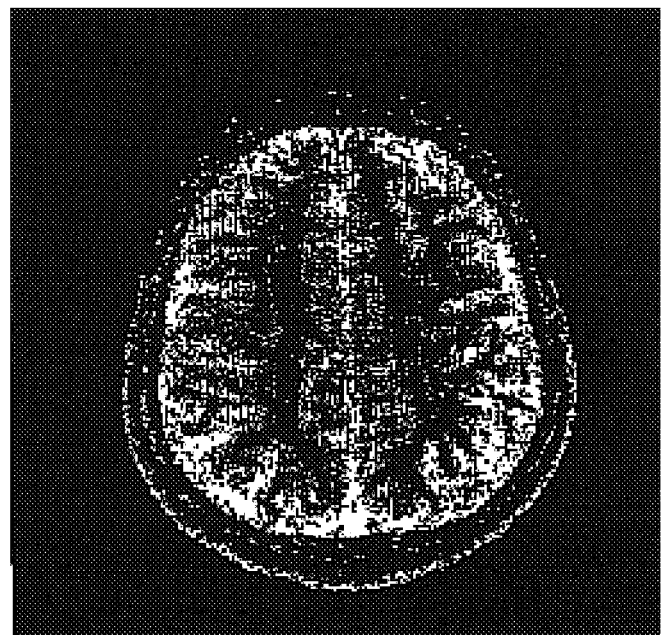

FIG. 4 shows the reconstructed relaxation map of a ghost image. Nine individual tubes are found in the ghost image. Eight of these tubes are filled with Gd-DTPA at differing concentrations, which can be clearly seen in the different grayscale values. The measurement was performed employing a method according to the invention in which after each 180° pulse, one k-space line per high-frequency pulse ($\alpha$) is recorded.

The imaging method according to the invention, the nuclear magnetic resonance scanner as well as the pulse train make it possible, for example, to acquire 20 slices at 16 different points in time for a matrix measuring 256×256 within a measuring time of 8 minutes and 28 seconds for purposes of determining the longitudinal relaxation time. Naturally, the number of slices, the matrix size as well as the number of measured points in time can all vary. The accuracy of the method described here in comparison to the standardized spectroscopic method is higher than 95%, in addition to which it entails the considerable advantage that data records of several slices and points in time can even be measured at all, or measured within a much shorter measuring interval.

The nuclear magnetic resonance scanner according to the invention is equipped with means that allow the generation of the pulse train according to the invention. The term "means that allow the generation of the pulse train according to the invention" refers to a data carrier that stores the information needed to emit the pulse train according to the invention and that emits said data to a high-frequency unit for purposes of providing the high-frequency pulses. In order to generate the pulse train according to the invention, coils that generate the magnetic fields that can be varied over time (gradients) as well as a computer that controls all system-related components are employed. Moreover, the nuclear magnetic resonance scanner according to the invention is fitted with an electronic evaluation system with which the measured data is sorted according to the invention.

EXAMPLE

Ghost image measurement with 90°/180° three k-space line sequence. $T_R$ (=repetition time)=13 msec; TI (=inversion time)=30 msec; TD (=delay time)=3 sec; $\alpha$ (=flip angle)=6°; 4 slices; slice thickness=8 mm; matrix size=256; FOV (=representation area)=250 mm; 48 points in time.

What is claimed is:

1. A group pulse-sequence signals suitable for determining spin-lattice (T1) relaxation times in a magnetic resonance scanning process, the group comprising:
   a high-frequency pulse;
   at least a 180° inversion pulse preceding the high frequency pulse;
   plural slice-selection gradient sequences;
   a k-space line coding gradient;
   wherein each of the pulse-sequence signals group are arranged in time such that data collection from two or more points in time and from at least two spatial slices is enabled to permit use of T1 relaxation times in the magnetic resonance scanning process.

2. The group of pulse-sequence signals of claim 1, further comprising a preceding 180° and a 90° pulse that precedes the 180° inversion pulse.

3. The group of pulse-sequence signals of claim 1, further comprising at least two consecutive gradients G(r), the at least two consecutive gradients G(r) being applied in a read-out direction and having reversed algebraic signs with respect to each other.

4. The group of pulse-sequence signals of claim 3, wherein the at least two consecutive gradients G(r) comprise three or more gradients applied in a read-out direction and having reversed algebraic signs with respect to each other.

5. A magnetic resonance imaging method which uses spin-lattice (T1) relaxation times for medical diagnosis, the method comprising:
   generating the group of pulse-sequence signals of claim 3;
   emitting high-frequency pulses and applying two or more magnetic gradient fields in response to the generated group of pulse-sequence signals;

selecting two or more areas in which a nuclear magnetic resonance occurs;

detecting respective measuring signals representative of the nuclear magnetic resonance in each of the selected areas; and reading out data during application of the at least two consecutive gradients G(r).

6. A magnetic resonance imaging method which uses spin-lattice (T1) relaxation times for medical diagnosis, the method comprising:

generating the group of pulse-sequence signals of claim 1;

emitting high-frequency pulses and applying at least one magnetic gradient field in response to the generated group of pulse-sequence signals;

selecting at least one area in which a nuclear magnetic resonance occurs; and detecting at least one measuring signal representative of the nuclear magnetic resonance in the selected area.

7. The magnetic resonance imaging method of claim 6, further comprising sorting data representing the measured signal; and applying a Fourier transformation to the sorted data.

8. A nuclear magnetic resonance scanner suitable for characterizing spin-lattice (T1) relaxation times, the scanner comprising:

means for generating the group of pulse-sequence signals of claim 1;

plural magnetic field generators responsive to one or more of the generated pulse sequence signals; and evaluation means for at least sorting data measured during one or more data collection periods.

9. The nuclear magnetic resonance of claim 8, wherein the evaluation means comprises means for applying a Fourier transformation to the sorted data.

10. A magnetic resonance imaging method which uses spin-lattice (T1) relaxation times for medical diagnosis, the method comprising:

generating pulse-sequence signals comprising a high-frequency pulse, at least a 180° inversion pulse-preceding the high-frequency pulse, plural slice-selection gradient sequences, a k-space line coding gradient, and at least two consecutive gradients G(r) applied in a read-out direction and having reversed algebraic signs with respect to each other;

emitting high-frequency pulses and applying at least two magnetic gradient fields in response to the generated group of pulse-sequence signals;

selecting at least two areas in which a nuclear magnetic resonance occurs; and detecting at least two signals representative of the nuclear magnetic resonance in the selected areas; and determining one or more spin-lattice (T1) relaxation times relating to material present in the selected areas.

11. A nuclear magnetic resonance scanner suitable for characterizing spin-lattice (T1) relaxation times, the scanner comprising:

means for generating pulse-sequence signals comprising a high-frequency pulse, at least a 180° inversion pulse preceding the high frequency pulse, plural slice-selection gradient sequences, a k-space line coding gradient, and at least two consecutive gradients G(r) are applied in a read-out direction which have reversed algebraic signs with respect to each other;

means for providing plural magnetic fields in response to one or more of the generated pulse-sequence signals, wherein at least two consecutive gradients G(r) are applied in a read-out direction which have reversed algebraic signs with respect to each other; and evaluation means for at least sorting data measured during one or more data collection periods and for performing a Fourier Transformation on the measured data.

* * * * *